(12) United States Patent
Neeman et al.

(10) Patent No.: US 8,200,733 B1
(45) Date of Patent: Jun. 12, 2012

(54) DEVICE HAVING INTERLEAVING CAPABILITIES AND A METHOD FOR APPLYING AN INTERLEAVING FUNCTION

(75) Inventors: Yuval Neeman, Ashquelon (IL); Ron Berkovich, Kfar Saba (IL); Guy Drory, Givatayim (IL); Gilad Dror, Moshav Beit Uziel (IL); Aviel Livay, Holon (IL); Yonatan Naor, Herzliya (IL)

(73) Assignee: Freescale Semiconductor, Inc., Austin, TX (US)

( * ) Notice: Subject to any disclaimer, the term of this patent is extended or adjusted under 35 U.S.C. 154(b) by 1070 days.

(21) Appl. No.: 12/102,996

(22) Filed: Apr. 15, 2008

(51) Int. Cl.
*G06F 7/38* (2006.01)
(52) U.S. Cl. .................................... 708/490
(58) Field of Classification Search .................. None
See application file for complete search history.

(56) References Cited

U.S. PATENT DOCUMENTS

| | | | |
|---|---|---|---|
| 5,737,252 A * | 4/1998 | Hollmann et al. ............ 708/254 |
| 6,591,381 B1 | 7/2003 | Kim et al. |
| 6,598,202 B1 | 7/2003 | Kim et al. |
| 6,637,000 B2 | 10/2003 | Rowitch et al. |
| 6,668,343 B1 | 12/2003 | Kim et al. |
| 6,751,773 B2 | 6/2004 | Okabayashi et al. |
| 6,857,087 B2 | 2/2005 | Crozier et al. |
| 7,805,655 B2 * | 9/2010 | Yu et al. ........................ 714/755 |
| 7,873,815 B2 * | 1/2011 | Sih et al. ....................... 712/221 |
| 7,904,761 B1 * | 3/2011 | Graham et al. ............... 714/702 |
| 2002/0016943 A1 | 2/2002 | Hunt |
| 2003/0033565 A1 | 2/2003 | Crozier et al. |
| 2007/0130494 A1 | 6/2007 | Divsalar et al. |
| 2007/0168844 A1 * | 7/2007 | Jeong et al. .................. 714/792 |
| 2007/0291868 A1 | 12/2007 | Olesen et al. |
| 2010/0064197 A1 * | 3/2010 | Halter .......................... 714/755 |
| 2011/0138260 A1 * | 6/2011 | Savin ........................... 714/795 |

FOREIGN PATENT DOCUMENTS

| | | |
|---|---|---|
| EP | 1097516 B1 | 12/2006 |
| WO | 00/60751 A1 | 10/2000 |
| WO | 00/70771 A1 | 11/2000 |

OTHER PUBLICATIONS

Oscar Y Takeshita, 'On Maximum Contention-Free Interleavers and Permutation Polynomials over Integer Rings', revised Nov. 1, 2005.

* cited by examiner

*Primary Examiner* — David H Malzahn

(57) ABSTRACT

A method and a device having interleaving capabilities, the device comprises a first interleaver; the first interleaver comprises a first register, a second register, a first adder and a second adder; wherein the first register is coupled to the first adder and to the second adder; wherein the second register is coupled to the second adder; wherein the first adder is adapted to add a current first register value to a first coefficient to provide a next first register value that is stored at the first register; wherein the second adder is adapted to add a current first register value to a second coefficient, to a third coefficient and to a current second register value to provide an interleaved output value.

20 Claims, 4 Drawing Sheets

DEVICE HAVING INTERLEAVING CAPABILITIES AND A METHOD FOR APPLYING AN INTERLEAVING FUNCTION

FIELD OF THE INVENTION

This disclosure relates generally to a device having interleaving capabilities and to a method for applying an interleaving function.

BACKGROUND OF THE INVENTION

Wireless communication systems are widely deployed to provide various types of communications such as voice and data. One such system is wide band code division multiple access WCDMA, which has been adopted in various competing wireless communication standards, for example third generation partnership project 3GPP, 3GPP project 2 (3GPP2) and long term evolution 3GPP (LTE 3GPP).

To overcome data corruption that can occur during RF transmission the different wireless communication standards typically include some form of channel coding, where one common channel coding technique is turbo coding.

Turbo coding involves the use of a turbo encoder for encoding a code segment (i.e. a data packet) and a turbo decoder for the decoding of the encoded code segment. A turbo encoder typically includes a pair of convolutional encoders, one of which receives information bits (i.e. systematic bits) while the other convolutional encoder receives interleaved information bits. The information bits are shuffled (interleaved) in accordance with a specified interleaving scheme. The pair of convolutional encoders output two sequences of parity bits that are modulated and transmitted to a receiver. The systematic bits are also modulated and transmitted to the receiver.

Turbo decoding is performed by an iterative process in which so called extrinsic information elements are exchanged between sub-blocks (also referred to as a processing units) of the turbo decoder. Extrinsic information elements are stored in multiple memory banks and form a block of a certain size (K). Each processing unit can apply a soft input soft output algorithm. In order to utilize multiple sub-blocks in an efficient manner the processing units should operate in a parallel contention free manner.

Various single access contention free interleavers were developed. A single access contention free interleaver can prevent contentions if each processing unit fetches, during a single fetch cycle, a single extrinsic information element. 3GPP LTE interleavers applies the following interleaving function: $phi(x)=(f1*x+f2*x^2)modulo(K)$, whereas f1 and f2 are set in response to the value of K, phi(x) is an interleaved output value, K is the number of information elements in an information block and x is an non-interleaved value that can be a non-interleaved address. The interleaved output value (phi(x)) is responsive to the squared value of variable x. Calculating the squared value of x requires an area-consuming multiplier. In devices that include multiple interleavers an inclusion of a dedicated multiplier in each interleaver results in larger area penalties. This area penalty is associated with increased cost and increased power consumption.

There is a need to simplify the implementation of an interleaver, especially when a single device includes multiple interleavers.

SUMMARY

The present invention provides a method and a system as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE DRAWINGS

A device and method are provided. The method and device can apply the following interleaving function: $phi(x)=(f1*x+f2*x^2)$ modulo (K) without using multipliers but rather use few adders and registers that are arranged to provide a double cascaded recursive interleaver.

Conveniently, the device can include multiple interleavers, each applying the mentioned above interleaving function so as to access a group of memory banks in a contention free manner.

Figure 1:
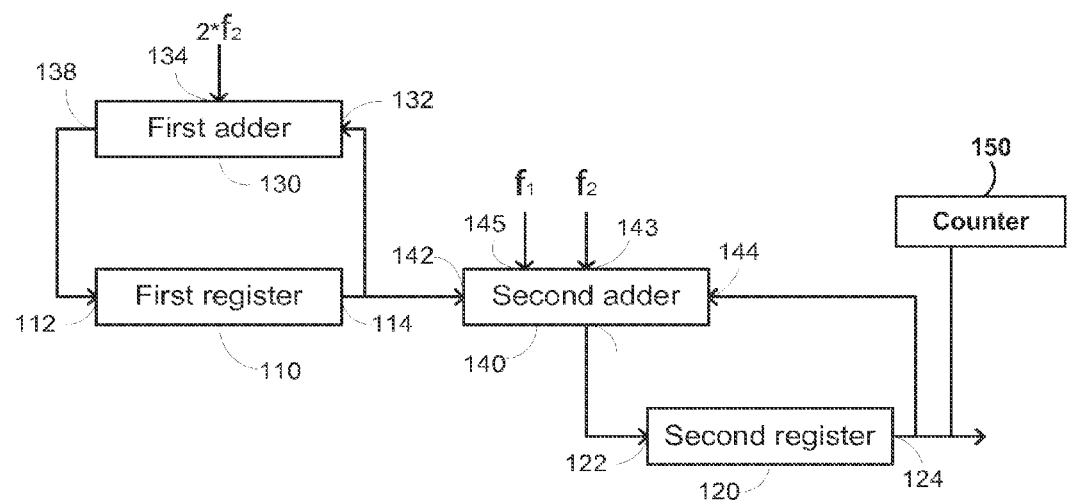
FIG. 1 illustrates an interleaver according to an embodiment of the invention.

FIG. 1 illustrates interleaver 100 according to an embodiment of the invention. Interleaver 100 includes first register 110, second register 120, first adder 130 and second adder 140. First register 110 is coupled to first adder 130 and to second adder 140. Second register 120 is coupled to second adder 140. The first adder is adapted to add a current first register value to a first coefficient to provide a next first register value that is stored at the first register. The second adder is adapted to add a current first register value to a second coefficient, to a third coefficient and to a current second register value to provide an interleaved output value. Conveniently, the first coefficient equals twice a first constant, the second coefficient equals the first constant and the third coefficient equals a second constant.

Especially, first input 132 of first adder 130 is coupled to output 114 of first register 110. First input 142 of second adder 140 is coupled to output 114 of first register 110. Second input 144 of second adder 142 is coupled to output 124 of second register 120. Output 138 of first adder 130 is coupled to input 112 of first register 110. Output 148 of second adder 140 is coupled to input 122 of second register 120. First adder 130 also receives twice a first constant (2f2) via second input 134 of first adder 130. Second adder 140 receives, by its third and fourth inputs 143 and 145, first constant f2 and second constant f1.

Each adder outputs a modulo K value. Alternatively, each adder is connected to a modulo K circuit.

During each interleaver cycle interleaver 100 calculates a new interleaved output value. Accordingly, during each interleaver cycle (for example—during the X'th interleaver cycle) the following operations occur: (i) first adder 130 adds a current first register value (R1(X−1)) to twice a first constant (2f2) to provide a next first register value (R1(X)) that is stored at first register 110; (ii) second adder 140 adds a current first register value (R1(X−1)) to the first constant (f2), to a second constant (f1) and to a current second register value (R2(X−1)) to provide an interleaved output value R2(X)= (f1*X+f2*X2)modulo(K). R2(X) equals phi (X).

Conveniently, interleaver 100 also includes counter 150 that counts interleaver cycles thus it provides a non-interleaved value X.

The following illustrates that the interleaved output value R2(X) actually equals (f1*X+f2*X2) modulo (K).

The difference between two consecutive interleaver output values (the X'th and the (X−1)'th) is: phi(X)−phi(X−1)= (f1*X+f2*X2)−(f1*(X−1)+f2*(X−1)2)=f1*x+f2*X2− (f1*X−f1+f2*X2−2*f2*X+f2)=2*f2*(X−1)+f1+f2=R2(X).

R2(X) recursion calculates Phi(x) given Phi(x−1). It easy to show that the step is 2*F2*(x−1)+f1+f2. 2*F2*(x−1) is calculated by R1(X) recursion given 2*F2*(x−2) by adding 2*F2 every step.

For example phi(X)=2x+3x^2 gives: R1[0]=0. R2[0]=0 Phy[0]=0; R1[1]=6. R2[1]=5 phy[1]=5; R1[2]=12 R2[1]=16 phy[1]=16 (R2=R2[1]+R1[1]+f1+f2=5+6+3).

Figure 2:
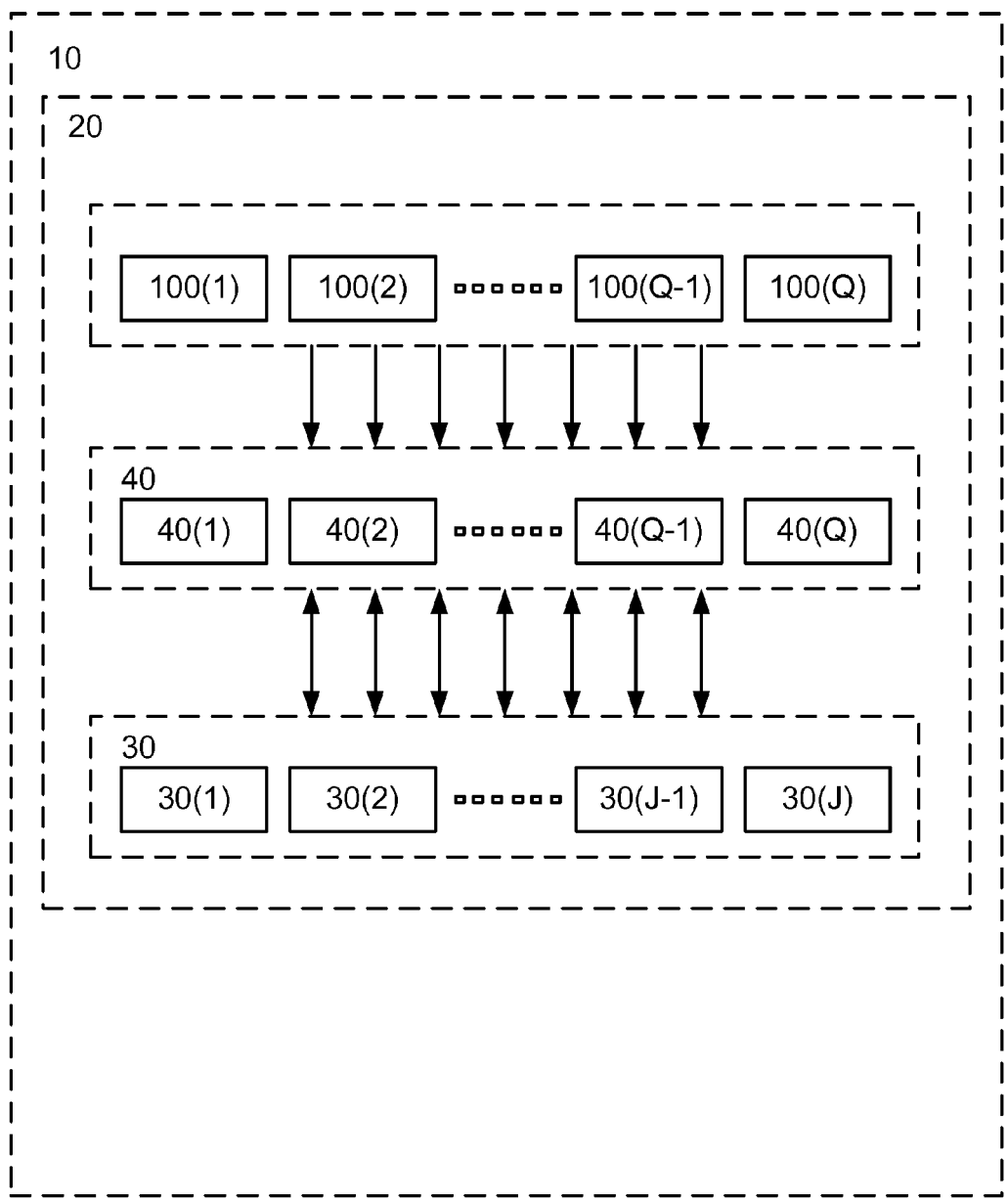
FIG. 2 illustrates a device according to an embodiment of the invention.

FIG. 2 illustrates device 10 according to an embodiment of the invention. Device 10 can be an integrated circuit, can include multiple integrated circuits, and can be a mobile device, a cellular phone, a personal digital assistant, a media player, a base station, a computer and the like.

Device 10 is illustrated as including turbo decoder 20. Turbo decoder 20 includes a group 30 of processing units 30(1)-30(J), and a group 40 of memory banks 40(1)-40(Q). Each processing unit can access a memory bank using an interleaver address outputted from an interleaver. FIG. 2 illustrates interleavers 100(1)-100(Q) as being coupled to memory banks 40(1)-40(Q). Conveniently, there are two memory banks per a processing unit thus 2*J=Q. It is noted that device 10 can have other configurations. For example, a single interleaver can be allocated per each processing unit. Yet for another example, the number of memory banks can equal the number of processing units.

Interleavers 100(1)-100(Q) are identical to each other and are analogues to interleaver 100 of FIG. 1. In order to allow theses different interleavers to access in parallel and in a contention free manner memory banks 40(1)-40(Q) different interleavers should be initialized to different initialization states. This can be achieved by allowing the different interleavers to execute different number of interleaver cycles each in order to output different interleaved output values at an end of an initialization stage.

If, for example, K equals 40 and there are four interleavers 100(1), 100(2), 100(3) and 100(4) then first interleaver 100(1) can be reset, second interleaver 100(2) can be reset and then execute ten interleaver cycles, third interleaver 100(3) can be reset and then execute twenty interleaver cycles and fourth interleaver 100(4) can be reset and then execute thirty interleaver cycles.

It is noted that each interleaver can be reset (or initialized to a certain value) by writing initialization values (such as but not limited to reset values) to the first and second register of each interleaver. This writing process can be implemented by adding a multiplexer at the input of each register. The multiplexer can receive an output of an adder or an initialization value. During reset the initialization value is selected, else the output of the adder is selected.

The mentioned above description referred to contention free access to a group of memory banks. This can be achieved in various manners even when using the same interleaving function. If the contention free access can involve fetching, by each processing unit of a group of processing units, a single interleaved address information per fetch cycle or can involve fetching consecutive interleaved address information elements by each processing unit per each fetch cycle. Consecutive interleaved address information elements information are generated by applying the mentioned above interleaving function on two consecutive (non-interleaved) addresses. Applying two consecutive interleaved addresses can be done by a simple interleaver in two consecutive cycles, but doing this does not improve decoding utilization. In order to apply two consecutive addresses in one cycle, a set of two interleavers need to be used with an adapted interleaving function to each one, such that the first interleaver provide the even addresses and the second provide odd. This technique can be applied to any number of N sequential addresses need to be provided in a single cycle.

If, for example, more than one information element is fetched per fetching cycle per processing unit that a set of K non-interleaved addresses is divided to N sub-sets of equal length (K/N). Each processing unit (30(*j*)) is associated with a unique sub-set of K/N non-interleaved addresses. The different processing units 30(1)-30(J)) scan (during multiple fetch cycles) their unique sub-sets of K/N non-interleaved addresses in a sequential manner and after applying the interleaving function access different memory banks out of 40(1)-40(Q). Conveniently, during each fetch cycle each processing units fetches a two consecutive interleaved address information elements.

If, for example, a single information element is fetched per fetching cycle then each memory bank 40(*q*) can store K/(2*N) information elements that are stored in a consecutive manner.

Figure 3:
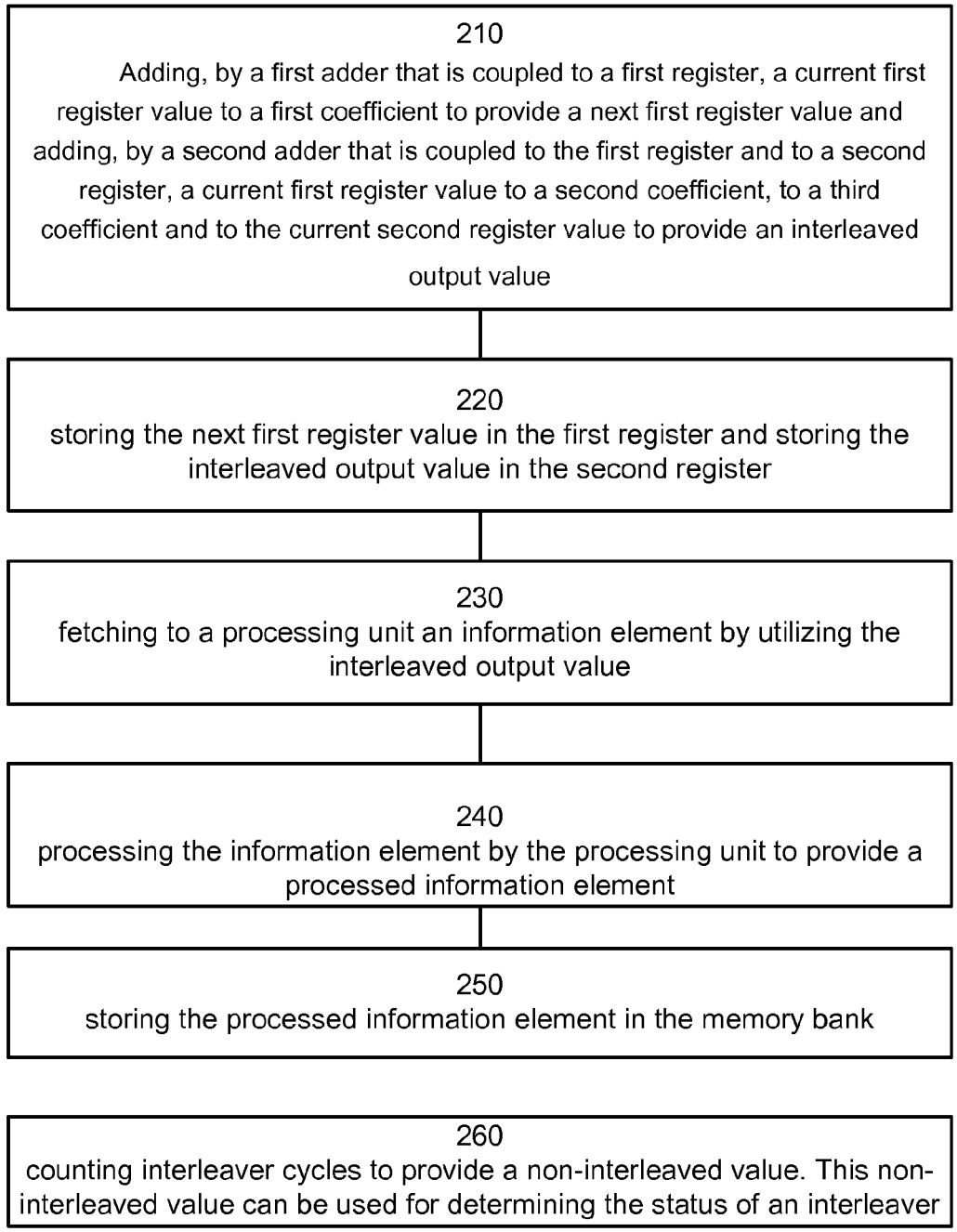
FIG. 3 illustrates a method according to an embodiment of the invention.

FIG. 3 illustrates method 200 for generating an interleaved output value, according to an embodiment of the invention.

Method 200 starts by stage 210 of adding, by a first adder that is coupled to a first register, a current first register value to a first coefficient (that can equal twice a first constant) to provide a next first register value and adding, by a second adder that is coupled to the first register and to a second register, a current first register value to a second coefficient (that can equal the first constant), to a third coefficient (that can equal a second constant) and to the current second register value to provide an interleaved output value.

Each adding operation includes performing a modulo k operation.

Stage 210 is followed by stage 220 of storing the next first register value in the first register and storing the interleaved output value in the second register.

Both stages 210 and 220 are executed during a single interleaver cycle.

Conveniently, stage 220 is followed by stage 230 of fetching to a processing unit an information element by utilizing the interleaved output value. Stage 230 is followed by stage 240 of processing the information element by the processing unit to provide a processed information element. Stage 240 is followed by stage 250 of storing the processed information element in the memory bank.

Conveniently, method 200 includes stage 260 of counting interleaver cycles to provide a non-interleaved value. This non-interleaved value can be used for determining the status of an interleaver.

It is noted that method 200 can be executed during a turbo decoding process and especially during a 3GPP LTE compliant turbo decoding process.

Figure 4:
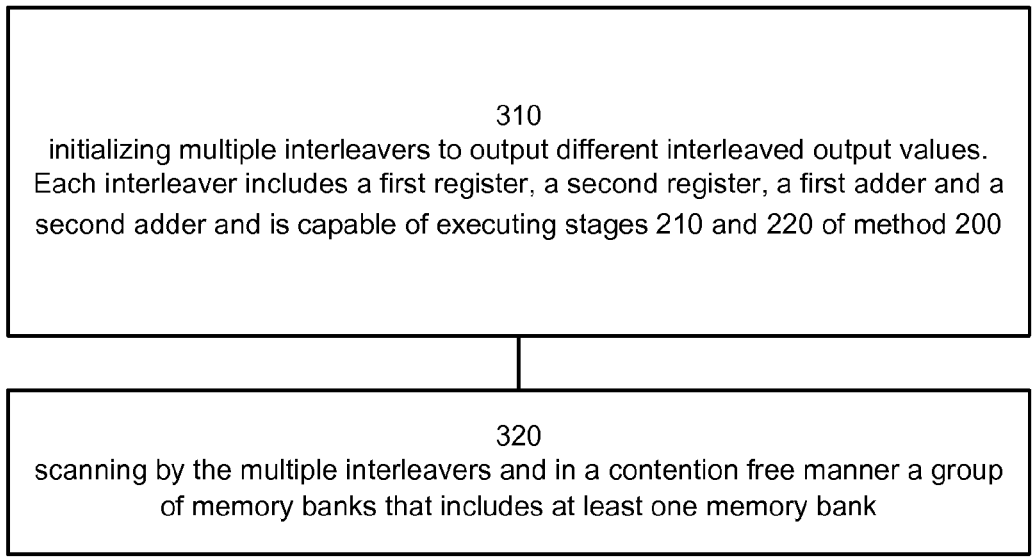
FIG. 4 illustrates a method according to another embodiment of the invention.

FIG. 4 illustrates method 300 for turbo decoding according to an embodiment of the invention.

Method 300 starts by stage 310 of initializing multiple interleavers to output different interleaved output values. Each interleaver includes a first register, a second register, a first adder and a second adder and is capable of executing stages 210 and 220 of method 200.

It is noted that stage 310 of initializing can include multiple iterations of method 200. Different interleavers are conveniently reset and then execute different amount of interleaving cycles during the initialization stage.

Stage 310 is followed by stage 320 of scanning by the multiple interleavers and in a contention free manner a group of memory banks that includes at least one memory bank.

The scanning includes generating multiple interleaved output values that are used as interleaved addresses during consecutive interleaved addresses (interleaved addresses that are associated with consecutive non-interleaved addresses) by the multiple interleavers.

Conveniently, the interleaved output value is a third generation partnership long term evolution compliant interleaved output value.

It is noted that information elements that are fetched from a memory bank is processed by a processing unit and then sent back to the memory bank.

It is noted that a single device or system can include multiple interleavers. For example, a device can include multiple pairs of interleavers, each pair can output two consecutive interleaved address in a single cycle. The first register of a first interleaver will be reset to zero and the first adder will add a current first register value to eight times a first constant to provide (after performing a modulo K operation) a next first register value. The second register of the first interleaver will be reset to zero and the second adder is adapted to add a current first register value to twice the first constant, to four times the second constant and to a current second register value to provide (after performing a modulo K operation) an interleaved output value.

The first register of a second interleaver will be reset to four times the second constant and the first adder will add a current first register value to eight times a first constant to provide (after performing a modulo K operation) a next first register value. The second register of the second interleaver will be reset to the sum of the first and second constants (modulo K) and the second adder is adapted to add a current first register value to twice the first constant, to four times the second constant and to a current second register value to provide (after performing a modulo K operation) an interleaved output value.

When pairs of interleavers are used or in any other case where a single interleaver does not output sequential interleaved output values, but rather outputs non-sequential interleaved output values then the first, second and third coefficients can differ from being equal to twice the first constant, the first constant and the second constant respectively. For example, in the mentioned above example, the first coefficient equals eight times the first constant, the second coefficient equals twice the first constant and the third coefficient equals four times the second constant.

It is further noted that groups of interleavers (that may include more than two interleavers) can be configured to output different interleaved outputs substantially simultaneously.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, FIG. 1 illustrates controller as being included in configurable receiver but this is not necessarily so. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

What is claimed is:

1. A device having interleaving capabilities, the device comprises:
a first interleaver, the first interleaver comprises; a first register, a second register, a first adder, and a second adder; wherein the first register is coupled to the first adder and to the second adder; wherein the second register is coupled to the second adder; wherein the first adder is adapted to add a current first register value to a first coefficient to provide a next first register value that is stored at the first register; and wherein the second adder is adapted to add the current first register value to a second coefficient, to a third coefficient and to a current second register value to provide an interleaved output value.

2. The device according to claim 1 wherein the first coefficient equals twice a first constant, the second coefficient equals the first constant and the third coefficient equals a second constant.

3. The device according to claim 1 comprising a counter that counts interleaver cycles to provide a non-interleaved value.

4. The device according to claim 1 comprising a group of interleavers that are identical to the first interleaver; wherein at an end of an initialization phase each interleaver outputs a different interleaved output value.

5. The device according to claim 4 wherein the group of interleavers scan in a contention free manner a group of memory banks that comprises at least one memory bank.

6. The device according to claim 1 further comprising a group of memory banks that comprises at least one memory bank; wherein the group of memory banks is coupled to the interleaver and is accessed by using the interleaved output value.

7. The device according to claim 1 wherein the first interleaver is a third generation partnership long term evolution compliant interleaver.

8. The device according to claim 1 wherein the first interleaver is a part of a turbo decoder.

9. The device according to claim 1 wherein a first input of the first adder is coupled to an output of the first register; a first input of the second adder is coupled to the output of the first register; a second input of the second adder is coupled to an output of the second register; an output of the second adder is coupled to an input of the second register.

10. The device according to claim 1 wherein the first interleaver is coupled to a first processing unit; wherein the processing unit processes an information element that is fetched, using the interleaved output value, from a memory bank to provide a processed information element; and wherein the processed information element is stored in the memory bank.

11. A method for generating an interleaved output value, the method comprises:
adding, by a first adder that is coupled to a first register, a current first register value to a first coefficient to provide a next first register value;
adding, by a second adder that is coupled to the first register and to a second register, the current first register value to a second coefficient, to a third coefficient and to the current second register value to provide an interleaved output value; and
storing the next first register value in the first register and storing the interleaved output value in the second register.

12. The method according to claim 11 wherein the first coefficient equals twice a first constant, the second coefficient equals the first constant and the third coefficient equals a second constant.

13. The method according to claim 11 comprising counting interleaver cycles to provide a non-interleaved value.

14. The method according to claim 11 comprising initializing multiple interleavers to output different interleaved output values; wherein each interleaver comprises a first register, a second register, a first adder and a second adder.

15. The method according to claim 11 comprising scanning by multiple interleavers in a contention free manner a group of memory banks that comprises at least one memory bank.

16. The method according to claim 11 comprising accessing a group of memory banks by using the interleaved output value.

17. The method according to claim 11 wherein the interleaved output value is a third generation partnership long term evolution compliant interleaved output value.

18. The method according to claim 11 wherein the method of claim 11 is performed during a turbo decoding process.

19. The method according to claim 11 wherein a first input of the first adder is coupled to an output of the first register; a first input of the second adder is coupled to the output of the first register; a second input of the second adder is coupled to an output of the second register; an output of the second adder is coupled to an input of the second register.

20. The method according to claim 11 comprising, fetching to a processing unit an information element by utilizing the interleaved output value; processing the information element by the processing unit to provide a processed information element; and storing the processed information element in the memory bank.

* * * * *